(12) United States Patent
Rokhsaz et al.

(10) Patent No.: US 7,224,760 B1
(45) Date of Patent: May 29, 2007

(54) HIGH-SPEED WIDE BANDWIDTH DATA DETECTION CIRCUIT

(75) Inventors: Shahriar Rokhsaz, Austin, TX (US); Moises E. Robinson, Austin, TX (US); Ahmed Younis, Austin, TX (US); Brian T. Brunn, Austin, TX (US)

(73) Assignee: Xilinx, Inc., San Jose, CA (US)

( * ) Notice: Subject to any disclaimer, the term of this patent is extended or adjusted under 35 U.S.C. 154(b) by 765 days.

(21) Appl. No.: 10/421,512

(22) Filed: Apr. 22, 2003

Related U.S. Application Data

(63) Continuation-in-part of application No. 10/346,435, filed on Jan. 17, 2003, now Pat. No. 6,977,959.

(51) Int. Cl.
 *H03D 3/24* (2006.01)
(52) U.S. Cl. .................. 375/376; 360/46; 360/51; 360/53; 370/335; 370/342; 375/327; 714/755
(58) Field of Classification Search .............. 375/375, 375/327, 376; 360/46, 51, 53; 370/335, 370/342; 714/755
See application file for complete search history.

(56) References Cited

U.S. PATENT DOCUMENTS

| | | | | |
|---|---|---|---|---|
| 5,878,097 A * | 3/1999 | Hase et al. | ................ | 375/371 |
| 5,889,828 A * | 3/1999 | Miyashita et al. | .......... | 375/374 |
| 6,144,714 A * | 11/2000 | Bleiweiss et al. | ........... | 375/376 |
| 6,285,640 B1 * | 9/2001 | Hayashi et al. | .......... | 369/47.29 |
| 6,307,906 B1 * | 10/2001 | Tanji et al. | ................. | 375/376 |
| 6,667,640 B2 * | 12/2003 | Asano | ........................ | 327/147 |
| 6,741,668 B1 * | 5/2004 | Nakamura | .................. | 375/376 |
| 6,995,618 B1 * | 2/2006 | Boecker | ...................... | 331/16 |
| 2002/0010010 A1 * | 1/2002 | Arnaud et al. | ............. | 455/574 |
| 2003/0081709 A1 * | 5/2003 | Ngo et al. | .................. | 375/362 |

OTHER PUBLICATIONS

Jafar Savoj, Behzad Razavi; "A 10-Gb/s CMOS Clock and Data Recovery Circuit with a Half-Rate Linear Phase Detector"; IEEE 2001; IEEE Journal of Solid-State Circuits, vol. 36, No. 5; May 2001; pp. 761-767.

* cited by examiner

*Primary Examiner*—David C. Payne
*Assistant Examiner*—Erin M. File
(74) *Attorney, Agent, or Firm*—Timothy W. Markison; Michael T. Wallace; Michael R. Hardaway

(57) ABSTRACT

A high-speed, wide bandwidth data detection circuit includes a phase detection module, a data detection module, a loop filter, and a voltage controlled oscillator. The phase detection module is operably coupled to produce a controlled current based on a current mode mathematical manipulation of differences between an incoming data stream and a recovered clock. The phase detection module performs the current mode mathematical manipulations and produces the controlled current in the current domain. The data detection module is operably coupled to produce the detected data based on the incoming data stream and the recovered clock. The loop filter is operably coupled to convert the controlled current into a controlled voltage. The voltage controlled oscillator is operably coupled to convert the control voltage into the recovered clock.

25 Claims, 10 Drawing Sheets high-speed, wide bandwidth data detection circuit 10

FIG. 2 high-speed, wide bandwidth data detection circuit 40 high-speed, wide bandwidth data detection circuit 80 phase detection module 12 and/or 48 phase detection module 12 and/or 48 phase detection module 12 and/or 48 modules 14, 48, 56, and 84 of FIG. 3

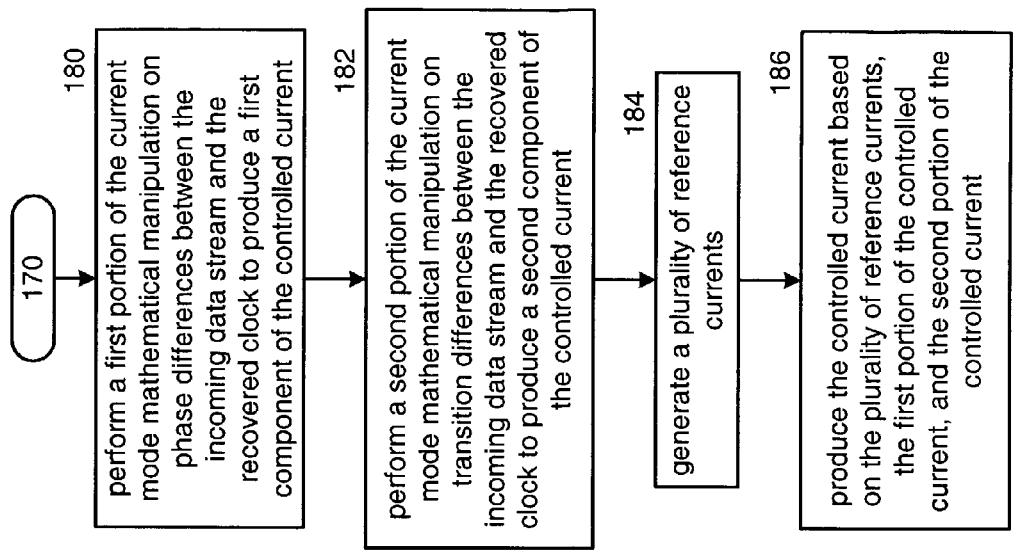
FIG. 10
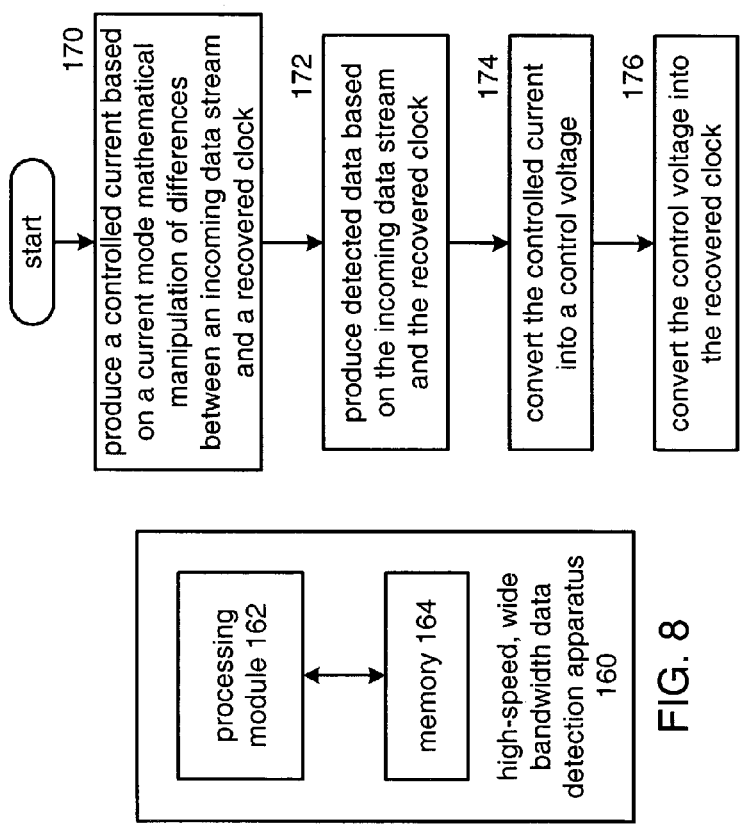
FIG. 9
FIG. 8

HIGH-SPEED WIDE BANDWIDTH DATA DETECTION CIRCUIT

TECHNICAL FIELD OF THE INVENTION

This invention relates generally to communication systems and more particularly to data and/or clock recovery circuits used therein.

BACKGROUND OF THE INVENTION

Communication systems are known to transport large amounts of data between a plurality of end user devices, which, for example, include telephones, facsimile machines, computers, television sets, cellular telephones, personal digital assistants, etc. As is also known, such communication systems may be local area networks (LANs) and/or wide area networks (WANs) that are stand-alone communication systems or interconnected to other LANs and/or WANs as part of a public switched telephone network (PSTN), packet switched data network (PSDN), integrated service digital network (ISDN), the Internet, etc. As is further known, communication systems include a plurality of system equipment to facilitate the transporting of data. Such system equipment includes, but is not limited to, routers, switches, bridges, gateways, protocol converters, frame relays, private branch exchanges, etc.

The transportation of data within communication systems is typically governed by one or more standards that ensure the integrity of data conveyances and fairness of access for data conveyances. For example, there are a variety of Ethernet standards that govern serial transmissions within a communication system at data rates of 10 megabits per second, 100 megabits per second, 1 gigabit per second and beyond. Another standard, which is for fiber optic data conveyances, is Synchronous Optical NETwork (SONET) that provides various high data rate protocols, including one for 10 gigabits per second. In accordance with such standards, many system components and end user devices of a communication system transport data via serial transmission paths. Internally, however, the system components and end user devices process data in a parallel manner. As such, each system component and end user device must receive the serial data and convert the serial data into parallel data without loss of information.

Accurate recovery of information from high-speed serial transmissions typically requires transceiver components to operate at clock rates that are equal to or higher than the rate of the received serial data, which, for today's high-speed systems, requires very high clock rates. Such high clock rates limit the usefulness of prior art clock and data recovery circuits since such clock and data recovery circuits require precise alignment of the received serial data with the high-speed clock to recover an embedded clock signal in the data stream and/or to recover the data, which is difficult to achieve using today's integrated circuit fabrication techniques. In addition, the high-speed serial data requires the clock and data recovery circuits to have a bandwidth wide enough to handle the high-speed serial data, which is also difficult to achieve using today's integrated circuit fabrication techniques.

As the demand for data throughput increases, so do the demands for precision high-speed serial transceivers (i.e., a transmitter and a receiver, where the receiver includes a clock and data recovery circuit). The increased throughput demands are pushing some current integrated circuit manufacturing processes to their operating limits, where integrated circuit processing limits (e.g., device parasitics, trace sizes, propagation delays, device sizes, etc.) and integrated circuit (IC) fabrication limits (e.g., IC layout, frequency response of the packaging, frequency response of bonding wires, etc.) limit the speed at which the high-speed serial transceiver, and particularly the clock and data recovery circuit, may operate without excessive jitter and/or noise.

A further alternative for high-speed serial transceivers is to use an IC technology that inherently provides for greater speeds. For instance, switching from a CMOS process to a silicon germanium or gallium arsenide process would allow integrated circuit transceivers to operate at greater speeds, but at substantially increased manufacturing costs. Currently, for most commercial-grade applications, including communication systems, such alternate integrated circuit fabrication processes are too cost prohibitive for wide spread use. In additional to the cost of these alternative IC fabrication processes, they do not lend themselves well to large-scale integration, especially when compared to CMOS IC fabrication processes.

Therefore, a need exists for a method and apparatus that can accurately recover data and a clock signal from received high-speed serial transmissions.

BRIEF SUMMARY OF THE INVENTION

The high-speed, wide bandwidth data detection circuit of the present invention substantially meets these needs and others. In one embodiment, a high-speed, wide bandwidth data detection circuit includes a phase detection module, a data detection module, a loop filter, and a voltage controlled oscillator. The phase detection module is operably coupled to produce a controlled current based on a current mode mathematical manipulation of differences between an incoming data stream and a recovered clock. The phase detection module performs the current mode mathematical manipulations and produces the controlled current in the current domain. The data detection module is operably coupled to produce the detected data based on the incoming data stream and the recovered clock. The loop filter is operably coupled to convert the controlled current into a controlled voltage. The voltage controlled oscillator is operably coupled to convert the control voltage into the recovered clock. Such a data detection circuit is readily applicable for accurately recovering data and a clock signal from high-speed serial transmissions.

In another embodiment, a high-speed, wide bandwidth data detection circuit includes a primary locked loop and a secondary locked loop. The secondary locked loop is operably coupled to provide an initial coarse locking for the primary locked loop when the primary locked loop is in an idle state. The primary locked loop is operably coupled, when in an active mode, to detect an incoming data stream and to produce detected data and a recovered clock therefrom. The primary locked loop includes a phase detection module, a data detection module, a loop filter, and a voltage controlled oscillator. The phase detection module is operably coupled to produce a controlled current based on a current mode mathematical manipulation of differences between the incoming data stream and the recovered clock. When the primary locked loop is in an idle state, the phase detection module produces a substantially zero net controlled current and when the primary locked loop transitions from the idle state to an active state, the phase detection module produces the controlled current in a known manner such that adverse current transients are negligible and loss of locking of the primary loop is avoided. The data detection module is operably coupled to produce the detected data based on the incoming data stream on the recovered clock. The loop filter is operably coupled to convert the controlled current into a controlled voltage. The voltage controlled oscillator is operably coupled to convert the controlled voltage into the recovered clock. Such a data detection circuit is readily applicable to accurately recover data and a clock signal from received high-speed serial transmissions.

In another embodiment, a high-speed, wide bandwidth data detection circuit includes a phase detection module, a data detection module, a frequency detector, a coarse charge pump, a loop filter, a common mode feedback circuit, a voltage controlled oscillator, and a divider module. The phase detection module is operably coupled to produce a primary controlled current based on a current mode mathematical manipulation of phase differences between an incoming data stream and a recovered clock when fine loop operation is enabled. The data detection module is operably coupled to produce the detected data based on the incoming data stream and the recovered clock. The frequency detector is operably coupled to produce a frequency difference signal based on frequency differences between a reference signal and a feedback signal when coarse loop operation is enabled.

The charge pump is operably coupled to convert the frequency difference signal into a secondary control current when the coarse loop operation is enabled. The loop filter is operably coupled to convert the primary controlled current or the secondary controlled current into a control voltage. The common mode feedback circuit is operably coupled to the loop filter to provide a common mode reference for both the primary and secondary control currents such that whether the high-speed, wide bandwidth data detection is in the fine loop operational mode or the coarse loop operational mode, the common mode voltage of the primary controlled current, secondary controlled current and control voltage is the same. The voltage controlled oscillator is operably coupled to convert the control voltage into the recovered clock when the fine loop operation is enabled and to convert the control voltage into an intermediate clock when the coarse loop operation is enabled. The divider module is operably coupled to produce the feedback signal based on the intermediate clock and a divider value. Such a data detection circuit is readily capable of accurately recovering data and a clock signal from received high-speed serial transmissions.

BRIEF DESCRIPTION OF THE SEVERAL VIEWS OF THE DRAWINGS

FIG. 8 is a schematic block diagram of a high-speed, wide bandwidth data detection apparatus in accordance with the present invention;

FIGS. 9–11 are a flowchart of a method for high-speed, wide bandwidth data detection in accordance with the present invention.

DETAILED DESCRIPTION OF THE INVENTION

Figure 1:
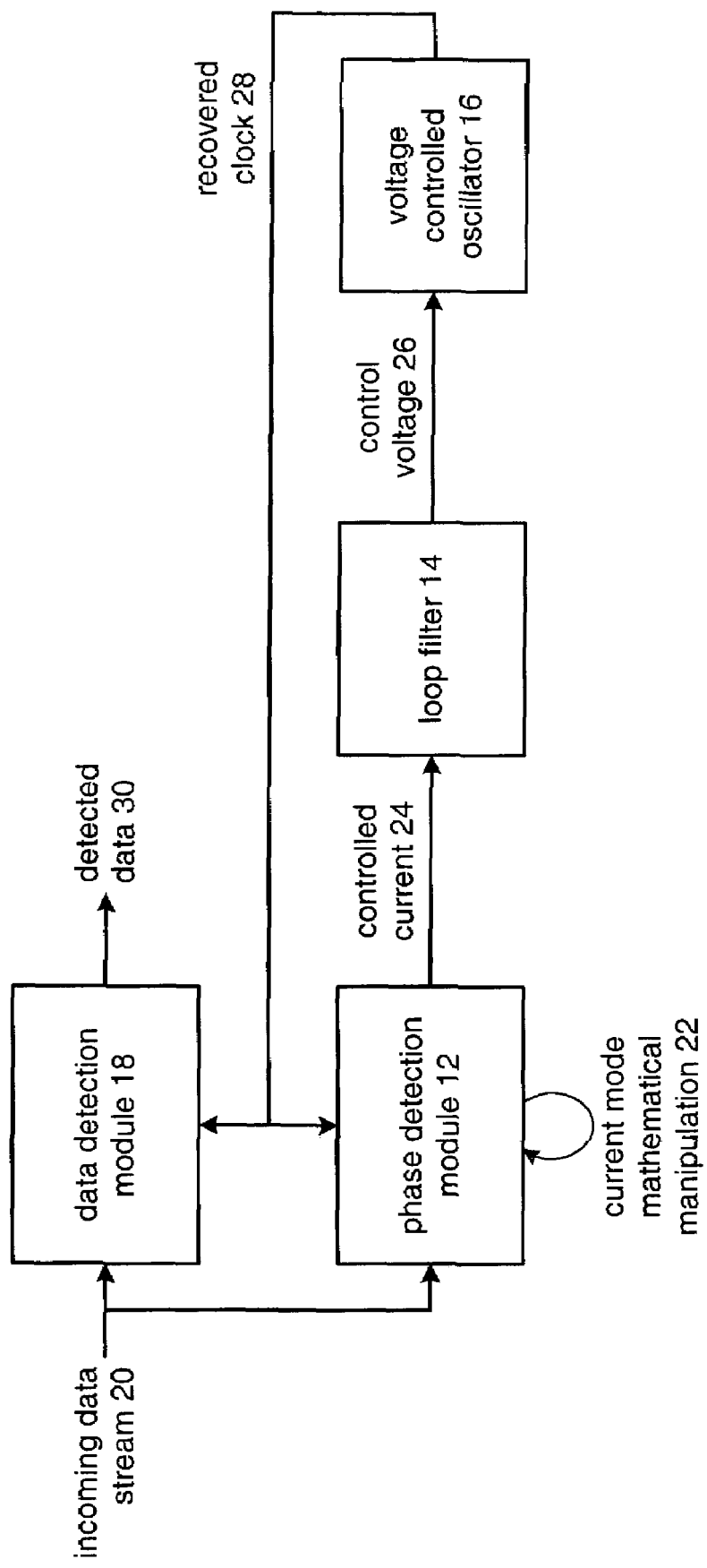
FIG. 1 is a schematic block diagram of a high-speed, wide bandwidth data detection circuit in accordance with the present invention.

FIG. 1 is a schematic block diagram of a high-speed wide bandwidth data detection circuit 10 that includes a phase detection module 12, loop filter 14, voltage controlled oscillator 16 and a data detection module 18. The phase detection module 12, which will be described in greater detail with reference to FIGS. 4–7, receives an incoming data stream 20 and a recovered clock 28. The phase detection module 12 performs a current mode mathematical manipulation 22 upon the phase differences between the incoming data stream 20 and the recovered clock 28 to produce a controlled current 24. The incoming data stream 20 may be a high-speed single-ended signaling transmission or differential signaling transmission.

The current mode mathematical manipulation 22 performed by the phase detection module 12 enables the phase detection module to determine whether the phase of the incoming data stream 20 leads or lags the recovered clock 28 and by how much. Based on the leading or lagging and the amount of leading or lagging, the phase detection module 12 creates the controlled current 24. The phase detection module 12 performs the current mode mathematical manipulation 22 in the current domain such that the phase detection module avoids a voltage-to-voltage-to-current transformation of the processing of the phase differences to produce a controlled signal as is done in prior art phase detection modules. Therefore, by avoiding the intermediate voltage conversion of the voltage-to-voltage-to-current transformation of the prior art, as is done by phase detection module 12, the introduction of any additional pole is avoided, thus, the speed and overall bandwidth of the data recovery and/or clock recovery is increased.

The loop filter 14 converts the controlled current 24 into a control voltage 26. The voltage control oscillator 16 converts the control voltage 26 into the recovered clock 28. Accordingly, the average of the controlled current 24 will represent the phase difference from the desired phase relationship of the phase of the incoming data and the phase of the recovered clock 28. Accordingly, if the phase of the recovered clock 28 is lagging the desired phase relationship, the overall loop response is too slow such that the controlled current 24 is generated to change the control voltage 26 to increase the rate of the recovered clock 28. By increasing the rate of the recovered clock 28, the desired phase relationship is reestablished.

Conversely, when the phase of the recovered clock 28 is lagging the desired phase relationship, the phase detection module 12 changes the controlled current 24 such that the control voltage 26 is changed. By changing the control voltage 26, the voltage controlled oscillator 16 generates a recovered clock 28 at a slightly slower rate. By slowing the rate of the recovered clock 28, the desired phase relationship is reestablished.

Figure 4:
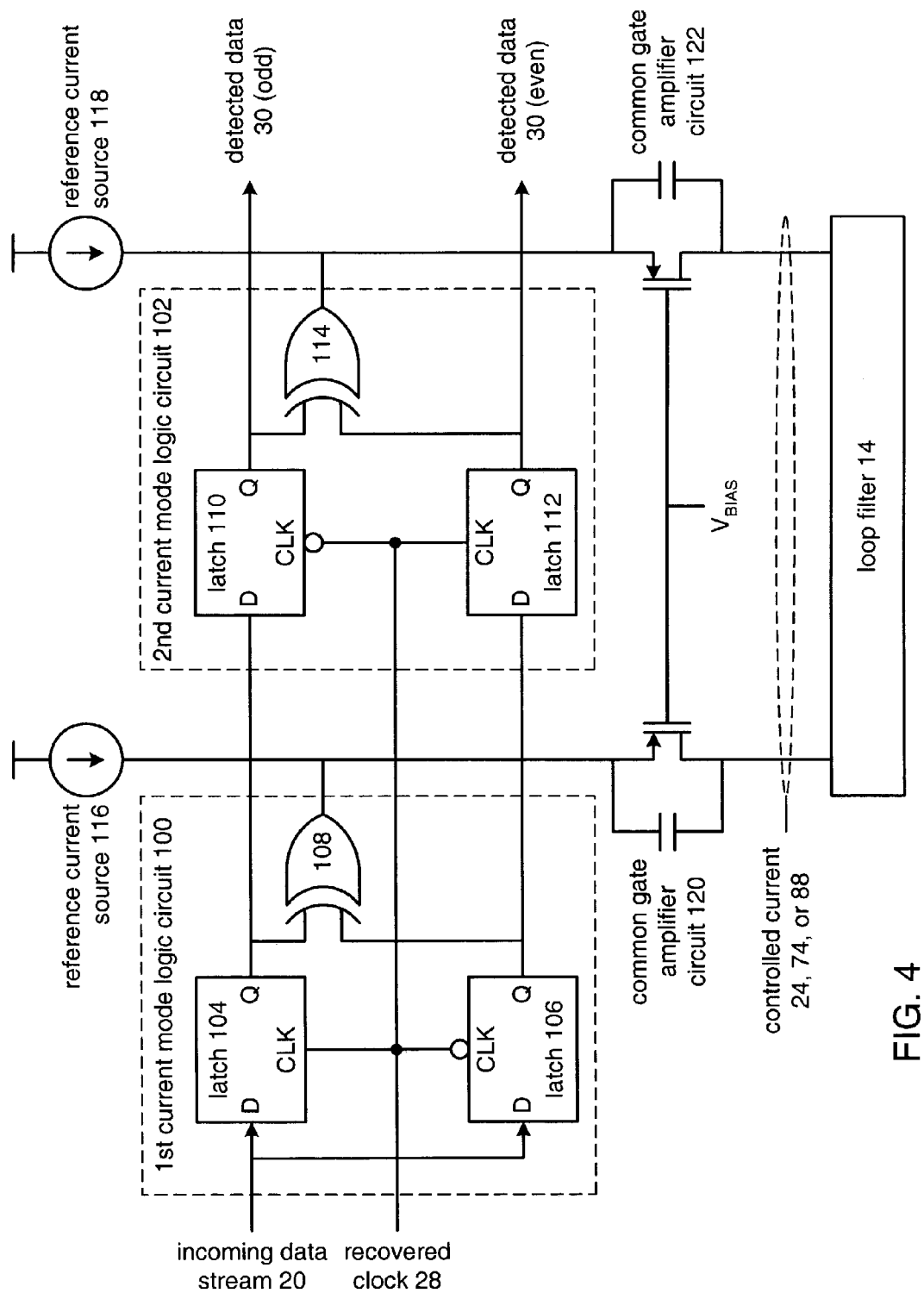
FIG. 4 is a schematic block diagram of a phase detection module in accordance with the present invention.
Figure 6:
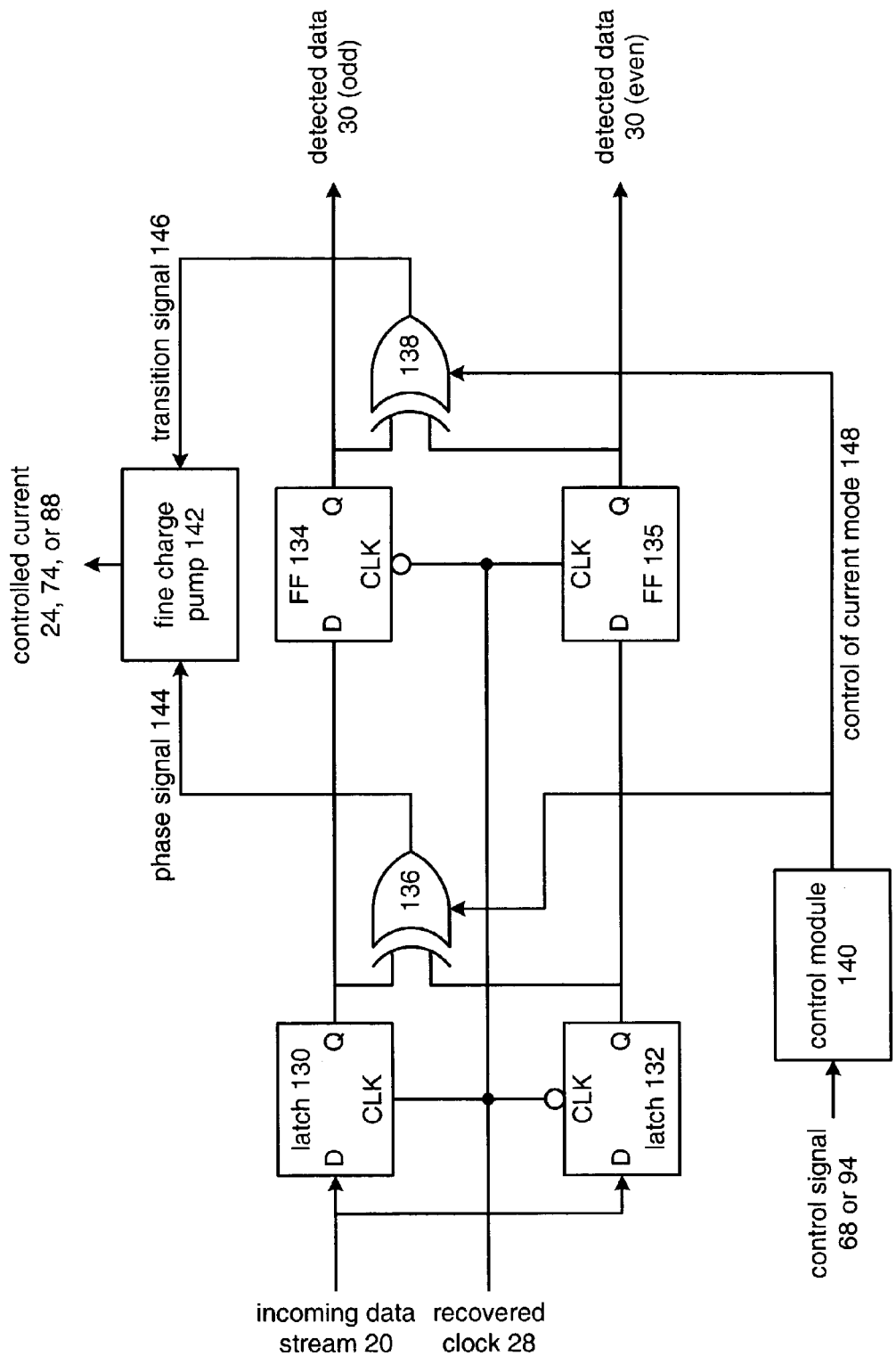
FIG. 6 is a schematic block diagram of yet another phase detection module in accordance with the present invention.

The data detection module 18 receives the incoming data stream 20 and, based on the recovery clock 28, generates detected data 30. The data detection module 18 may be a separate device from the phase detection module 12 or incorporated within the phase detection module 12. Examples of integrating the data detection module 18 with the phase detection module 12 are illustrated in FIGS. 4 and 6.

Figure 2:
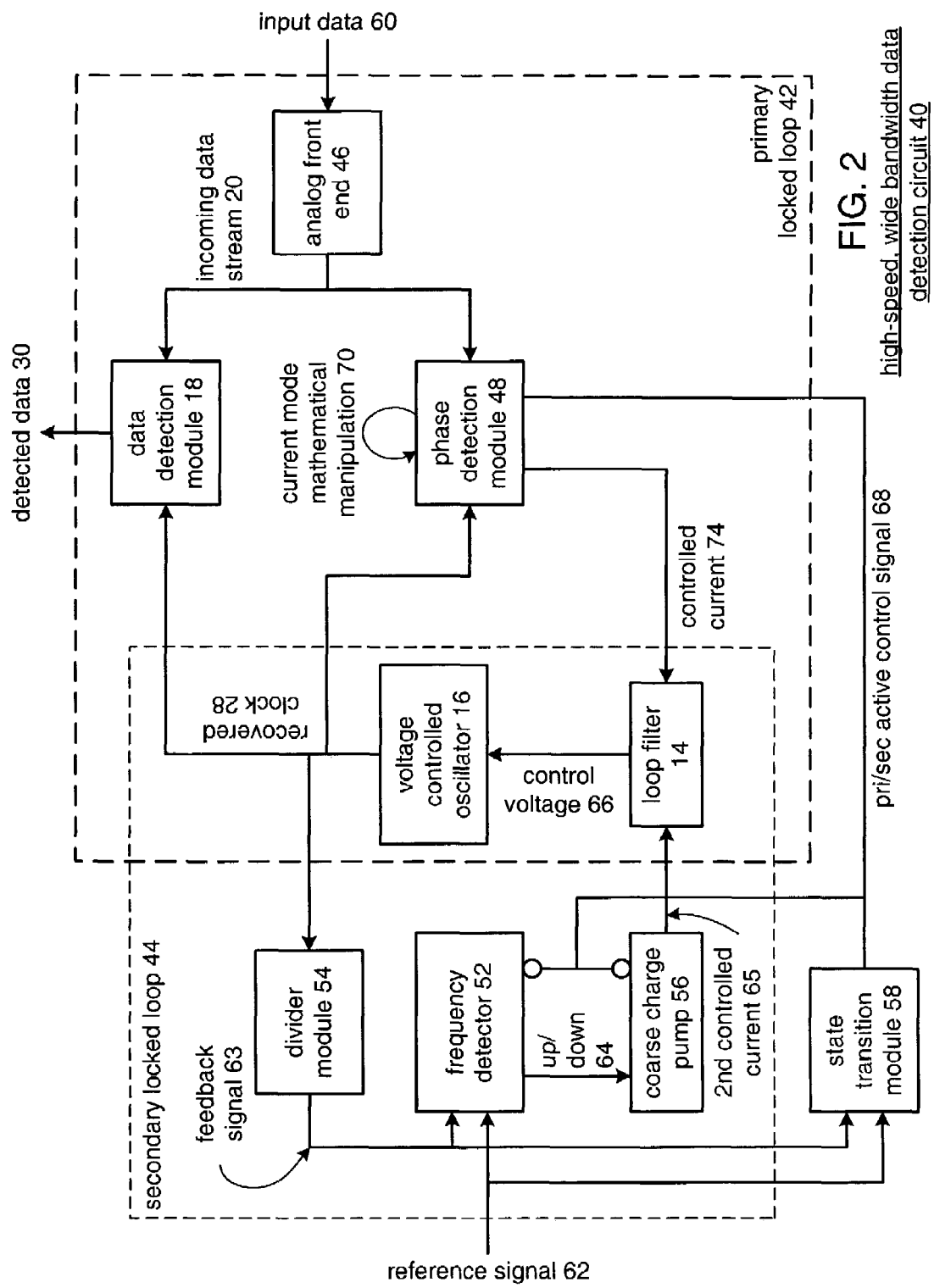
FIG. 2 is a schematic block diagram of another high-speed, wide bandwidth data detection circuit in accordance with the present invention.

FIG. 2 illustrates a schematic block diagram of high-speed, wide bandwidth data detection circuit 40 that includes a primary locked loop 42 and a secondary locked loop 44. The primary locked loop 42 includes an analog front-end 46, the data detection module 18, a phase detection module 48, a loop filter 14, and a voltage controlled oscillator 16. The secondary locked loop 44 shares the loop filter 14 and the voltage controlled oscillator 16 with the primary locked loop 42 and further includes a divider module 54, a frequency detector 52, and a coarse charge pump 56. The high-speed wide bandwidth data detection circuit 40 further includes a state transition module 58 that coordinates the transition from a coarse mode of operation (i.e., the secondary locked loop 44 is active and the primary locked loop is idle) to the fine mode of operation (i.e., the primary locked loop 42 is active and the secondary locked loop is idle).

In operation, the high-speed wide bandwidth data detection circuit 40 begins in the coarse loop mode such that the secondary locked loop 44 is active and the primary locked loop 42 is in an idle mode. To place the high-speed wide bandwidth data detection circuit 40 in the coarse mode, the state transition module 58 generates an output signal that enables the frequency detector 52 and the coarse charge pump 56 while disabling the phase detection module 48. The phase detection module 48 may be disabled by controlling the net current produced thereby to be substantially zero (i.e., within a fraction of a micro-amp to a few microamps of zero).

In the coarse mode, the frequency detector 52 generates an up/down signal 64 based on frequency differences, and possibly phase differences, between a reference signal 62 and a feedback signal 63. The frequency detector 52 produces the up signal, which is intended to speed up the output of the voltage controlled oscillator when the frequency of the reference signal 62 leads the feedback signal 63. Conversely, the frequency detector 52 produces the down signal, which is intended to slow down the output of the voltage controlled oscillator 16 when the frequency of reference signal 62 lags the frequency of feedback signal 63. Note that the reference signal, or reference clock, 62 may be generated by a crystal oscillator that produces a 10 megahertz clock rate, 20 megahertz clock rate, et cetera.

The coarse charge pump 56 generates a $2^{nd}$ controlled current 65 based on the up or down signal 64. The loop filter 14 converts the $2^{nd}$ controlled current 65 into a control voltage 66. The voltage controlled oscillator 16 converts the control voltage 66 into an output oscillation that is divided by divider module 54 to produce the feedback signal 63.

The state transition module 58 monitors the frequency differences between the reference signal 62 and feedback signal 63. As such, the state transition module 58 may be a frequency detection module that includes logical circuitry to control the generation of the primary/secondary active control signal 68. Once the secondary locked loop 44 is frequency locked, the state transition module 58 transitions the primary/secondary active control signal 68 such that the primary locked loop 42 becomes active and the secondary locked loop 44 becomes inactive, or idle. To do this, the phase detection module 48 is enabled while the frequency detector 52 and coarse charge pump 56 are disabled. In general, the secondary locked loop 44 establishes an initial locking frequency for the primary locked loop 42 and its performance is based on a knowledge of the rate of the incoming data stream 20. While the rate of the incoming data stream 20 is known, the phase relationship with respect to the recovered clock 28 is not. Accordingly, a primary function of the primary locked loop 42 is to phase synchronize the output oscillation generated by the VCO 16 with the incoming data stream 20 to produce the recovered clock 28.

To achieve locking of the primary locked loop 42, the analog front-end 46 converts input data 60, which may be an optical signal that is converted to an electrical signal, an analog signal that is converted to a digital signal, a digital signal that is converted to an analog signal, et cetera, into the incoming data stream 20. The analog front-end 46 provides the incoming data stream 20 to the data detection module 18 and to the phase detection module 48. The data detection module 18 produces the detected data 30 based on the recovered clock 28.

The phase detection module 48 performs a current mode mathematical manipulation 70 on the phase differences between the incoming data stream 20 and the recovery clock 28 to produce the controlled current 74. The phase detection module 48 generates the controlled current 74 when the primary/secondary activation control signal 68 enables the phase detection module 48. When the primary/secondary active control signal 68 places the phase detection module 48 in an idle mode, the phase detection module 48 generates a controlled current 74 having a net current value of approximately zero (+/−a fraction of a micro-amp to a few micro-amps). This may be done by controlling circuitry within the phase detection module such that when the data detection circuit 40 transitions from the coarse operation to the fine operation, the controlled current 74 produced by the phase detection module is done in a known manner (i.e., start at zero current).

The known manner substantially eliminates any adverse current transients during the transition from the coarse mode to the fine mode. As such, by controlling the output current of the phase detection module 48 to be zero in the idle mode as opposed to disabling the circuitry within the phase detection module 48, which would require the internal circuitry to go through a turn-on time that may take many data bits to settle producing adverse transient effects. Such adverse transient effects may throw the primary locked loop 42 out of its capture range, which results in inaccuracy in recapturing the detected data 30. The phase detection module 48 avoids these adverse transient effects and will be described in greater detail with reference to FIGS. 4–7.

The loop filter 14 converts the controlled current 74 into a control voltage 66. The voltage controlled oscillator 16 converts the control voltage 66 into the recovered clock 28. Note that when the secondary locked loop 44 reached a locked state, it produces a control voltage 66 and a corresponding output oscillation that are substantially close to the control voltage and output frequency (i.e., recovered clock) produced by the primary locked loop 42 when it is locked. As such, by insuring that the phase detection module 48 does not produce current transients when switching from the secondary locked loop 44 to the primary locked loop 42, the control voltage 66 and the resulting output oscillation do not experience any adverse effects due to the transition.

Figure 3:
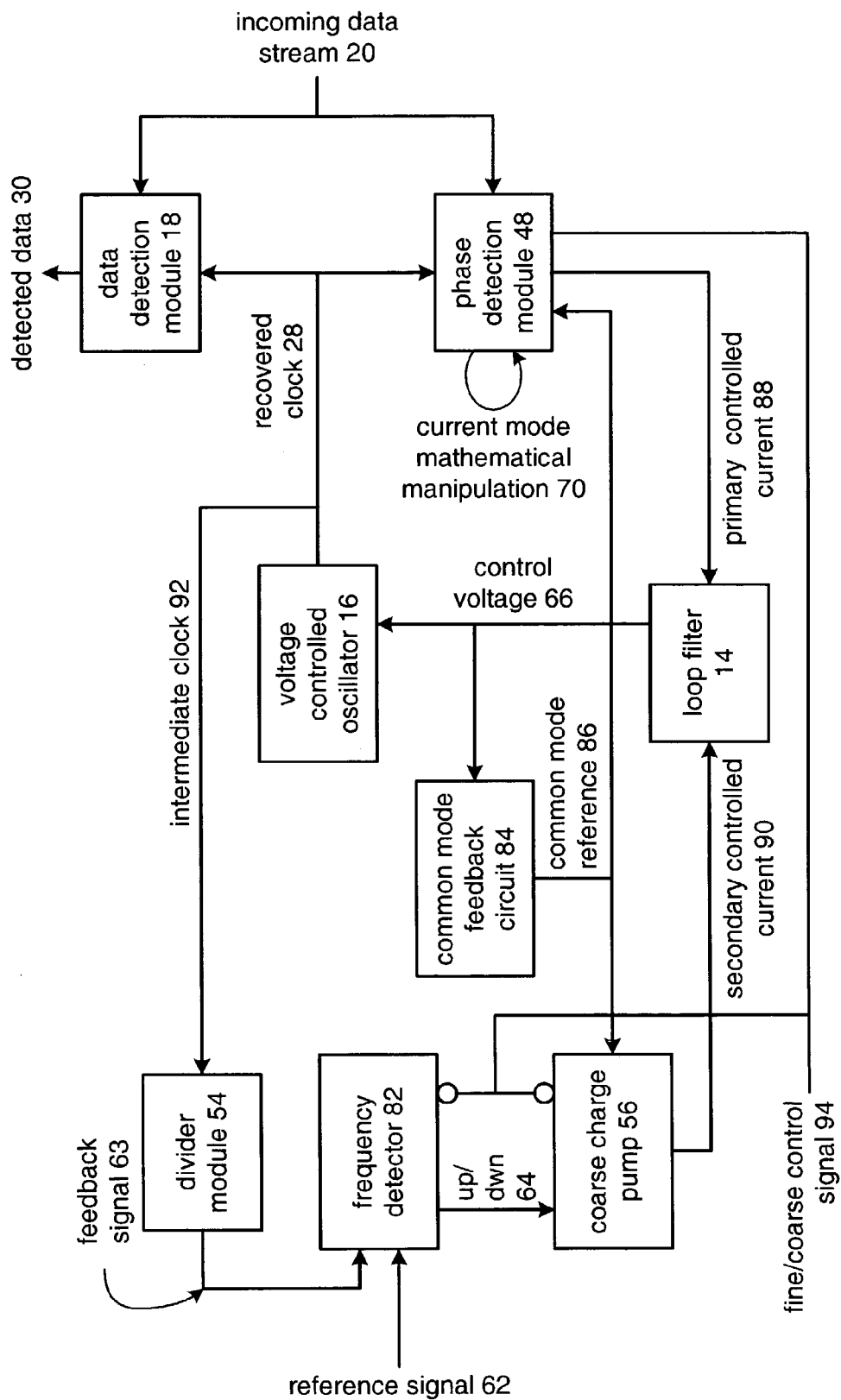
FIG. 3 is a schematic block diagram of yet another high-speed, wide bandwidth data detection circuit in accordance with the present invention.

FIG. 3 is a schematic block diagram of another high-speed, wide bandwidth data detection circuit 80 that includes the loop filter 14, the data detection module 18, the phase detection module 48, the voltage controlled oscillator 16, a common mode feedback circuit 84, the divider module 54, a frequency detector 82, and a coarse charge pump 56.

In operation, the high-speed, wide bandwidth data detection circuit 80 begins in the coarse mode such that the fine/coarse control signal 94 enables the frequency detector 82 and coarse charge pump 56 while placing the phase detection module 48 in the idle mode. In the coarse mode, the frequency detector 82 determines a frequency and/or phase difference between a reference signal 62 and a feedback signal 63 to produce an up/down signal 64. The coarse charge pump 56 converts the up/down signal 64 into a secondary controlled current 90. The loop filter 14 converts the secondary controlled current 90 into control voltage 66.

The common mode of the loop filter 14 is biased based on the common mode reference 86 that is produced by the common mode feedback circuit 84. The common mode feedback circuit 84 will be described in greater detail with reference to FIGS. 5 and 7 but in general produces a single common mode reference 86 for the loop filter 14 regardless of whether the high-speed, wide bandwidth data detection circuit is in the idle mode (i.e., in the coarse mode) or in the active mode (i.e., the fine mode). By utilizing a single common mode reference 86, as opposed to separate common mode references for the secondary controlled current 90 and the primary controlled current 88, which compete to establish the common mode for the loop filter 14 and, as a result, generate common mode noise that adversely effects the performance of the data detection circuit 80, such adverse effects are avoided.

The voltage controlled oscillator 16 converts the control voltage 66 into an intermediate clock 92. The divider module 54 divides the intermediate clock 92 by a divider value to produce the feedback signal 63. The intermediate clock 92 will have a rate approximately equal to one-half the rate of the incoming data stream 20.

When the mode of operation changes from the coarse mode to the fine mode, the fine/coarse control signals 94 places the frequency detector 82 and coarse charge pump 56 in an idle state and activates the phase detection module 48. In the fine mode of operation, the data detection module 18 recovers data 30 from the incoming data stream 20 based on the recovery clock 28.

The phase detection module 48 performs a current mode mathematical manipulation 70 on phase differences between the incoming data stream 20 and the recovered clock 28 to produce the primary control current 88. The loop filter 14 converts the primary control current 88 into control voltage 66. The voltage controlled oscillator 16 converts the control voltage 66 into the recovered clock 28. As mentioned with reference to FIG. 2, the intermediate clock 92 is approximately equal to the recovered clock 28 such that the differential and common mode of the control voltage 66 produced by the primary control current 88 is substantially equal to the differential and common mode of the control voltage produced in accordance with the secondary control current 90, where the primary and secondary control currents 88 and 90 are biased based on the same common mode reference 86 such that common mode noise and the corresponding adverse effects are substantially avoided.

FIG. 4 is a schematic block diagram of phase detection module 12 and/or 48. The phase detection module includes a $1^{st}$ current mode logic circuit 100, a $2^{nd}$ current mode logic circuit 102, a plurality of reference current sources 116 and 118, and a pair of common gate amplifier circuits 120 and 122. The $1^{st}$ current mode logic circuit 100 includes latches 104 and 106 and a current mode exclusive OR gate 108. The $2^{nd}$ current mode logic circuit 102 includes latches 110 and 112, which may be flip-flops, and a current mode exclusive OR gate 114. The $1^{st}$ current mode logic circuit 100 performs a $1^{st}$ portion of the current mode mathematical manipulation on the phase differences between the incoming data stream and the recovered clock to produce a $1^{st}$ component of the controlled current. The $2^{nd}$ current mode logic circuit 102 performs a $2^{nd}$ portion of the current mode mathematical manipulation based on transitions of the incoming data stream and the recovered clock.

Latches 104 and 106 of the $1^{st}$ current mode logic circuit clock in the incoming data stream 20 based on the recovered clock 28 and an inversion of the recovered clock 28. The outputs of latches 106 and 108 are exclusive ORed together via current mode exclusive OR gate 108 to produce a current that is added to the current produced by the reference current source 116 to produce a portion of the controlled current 24, 74 or 88. Accordingly, the functionality of the latches 104 and 106 in combination with the current mode exclusive OR gate 108 perform the $1^{st}$ portion of the current mode mathematical manipulation.

The $2^{nd}$ current mode logic circuit 102 performs the $2^{nd}$ portion of the current mode mathematical manipulation on transition differences between the incoming data stream and the recovered clock to produce a $2^{nd}$ component of the controlled current 24, 74 or 88. As illustrated, latch 110 clocks in the output of latch 104 based on an inversion of the recovery clock 28. Latch 112 clocks in the output of latch 106 based on the recovered clock 28. Current mode exclusive OR gate 114 exclusive ORs the outputs of latches 110 and 112 to produce a current mode transition signal, which in combination with the current sourced by the reference current source 118, provides the $2^{nd}$ component of the controlled current 24, 74 or 88. In addition to producing the controlled current, the module 12 and/or 48 produces the detected data 30 and even detected data and odd detected data.

In this embodiment, the current mode exclusive OR gates 108 and 114 form, in combination with the reference current sources 116 and 118, a charge pump circuit that produces the controlled current 24, 74 or 88. As such, by using the current mode exclusive OR gates 108 and 114 as a part of the charge pump circuit, the voltage-to-voltage-to-current conversion of prior art phase detectors and charge pumps is avoided thereby increasing the bandwidth of the data detection circuitry and improving its capacity to process high-speed data transmissions.

Figure 5:
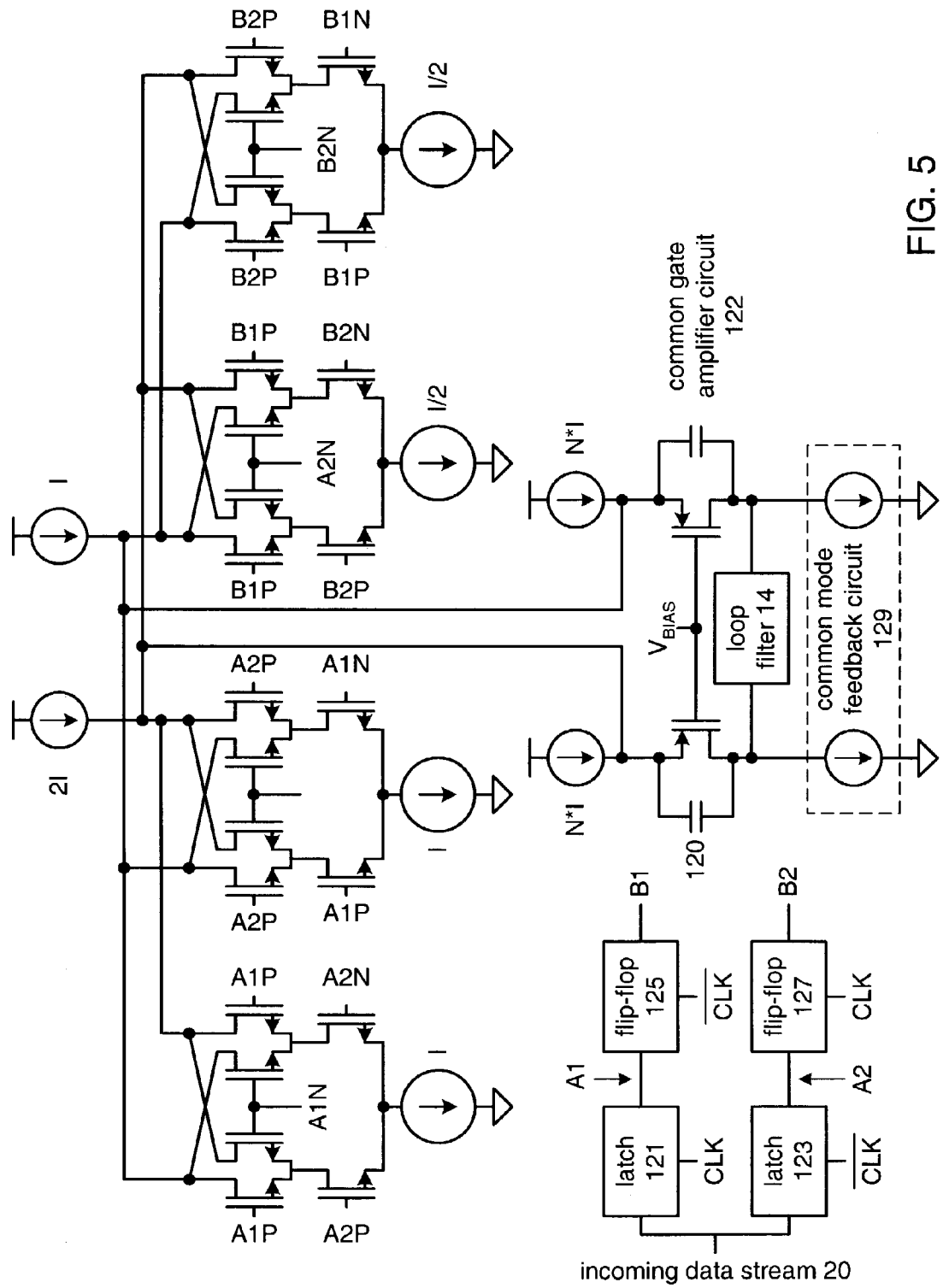
FIG. 5 is a schematic block diagram of another phase detection module in accordance with the present invention.

FIG. 5 illustrates an alternate schematic block diagram of phase detection module 12 and/or 48. In this embodiment, the signaling is differential and the current mode exclusive OR gates are illustrated in transistor form. The inputs for the exclusive OR gates are produced by latches 121, 123 and flip-flops 125 and 127. As shown, latch 121 clocks in the incoming data stream 20 based on a clock signal (CLK), which corresponds to the recovered clock, and latch 123 clocks in the incoming data stream 20 based on an inversion of the clock. The output of latch 121 (A1) includes a positive leg (A1P) and a negative leg (A1N). The output of latch 123 (A2) has a positive leg (A2P) and a negative leg (A2N). These differential outputs of the latches 121 and 123 drive the transistors of current mode exclusive OR gate 108 as shown.

Flip-flops 125 and 127 generate the signaling B1 and B2 that drive the transistors on the right side of the figure which correspond to current mode exclusive OR gate 114. The resulting currents produced by the exclusive OR gates 108 and 114 are summed with a 2I reference current, an I reference current, and two N*I reference currents. The resulting current is provided via the common gate amplifier circuits 120 and 122 to the loop filter 14. The common mode of the control current is biased via the common mode feedback circuit 84. As shown, the common mode feedback circuit 84 includes two current sources.

FIG. 6 illustrates a schematic block diagram of another embodiment of the phase detection module 12 and/or 48. In this embodiment, the phase detection module includes latches 130 and 132, flip-flops 134 and 135, exclusive OR gates 136 and 138, fine charge pump 142, and a control module 140. The control module 140 generates a control of current mode signal 48 based on the fine or coarse loop control signals 68 or 94. For instance, when the data detection circuit is in a coarse mode, i.e., the primary loop is in an inactive mode or idle mode, the control module 140 generates signal 48 such that the output of exclusive OR gate 136 and the output of exclusive OR gate 138 are zero. This may be done in a variety of ways. For instance, the control module 140 may force the outputs of exclusive OR gates to zero; may force the inputs of the exclusive OR gates to the same logical state (i.e., force the inputs to a logic one or a logic zero); may force the inputs of the latches 130 and 132 to a known state such that the outputs are both identical (e.g., both outputs are either a logic 1 or a logic 0). By doing this, the fine charge pump 42 stays active (i.e., its internal components are not turned off, which encounters a start up delay when activated) during the coarse mode but produces a net zero controlled current. When the mode of the data detection circuit changes to the fine mode of operation, i.e., the primary locked loop becomes active, the functionality of the exclusive OR gates 136 and 138 are enabled to act according to the data being received and the start up issues of the charge pump components are avoided.

During the fine mode of operation, the control module 140 enables the exclusive OR gates 136 and 138 to function based on the inputs they receives. In this mode, latch 130 clocks in the incoming data stream 20 based on the recovery clock 28 while latch 132 clocks in the incoming data stream 20 based on an inversion of the recovered clock 28. The exclusive OR gate 136 exclusive ORs the outputs of latches 130 and 132 to produce a phase signal 144 that represents phase differences between the incoming data stream and the recovered clock 28.

Flip-flop 134 clocks in the output of latch 132 based on an inversion of the recovered clock 28 while flip-flop 135 clocks in the output of latch 132 based on the recovered clock 28. The output of flip-flops 134 and 135 provide the detected data outputs 30 and also provide inputs to exclusive OR gate 138. Exclusive OR gate 138 exclusive ORs the outputs of flip-flop 134 and 135 to produce a transition signal 146.

The fine charge pump 142 utilizes the phase signal 144 and transition signal 146 to produce the controlled current 24, 74 or 88. Note that the phase signal 144 and transition signal 146 may be current mode signals or voltage mode signals.

Figure 7:
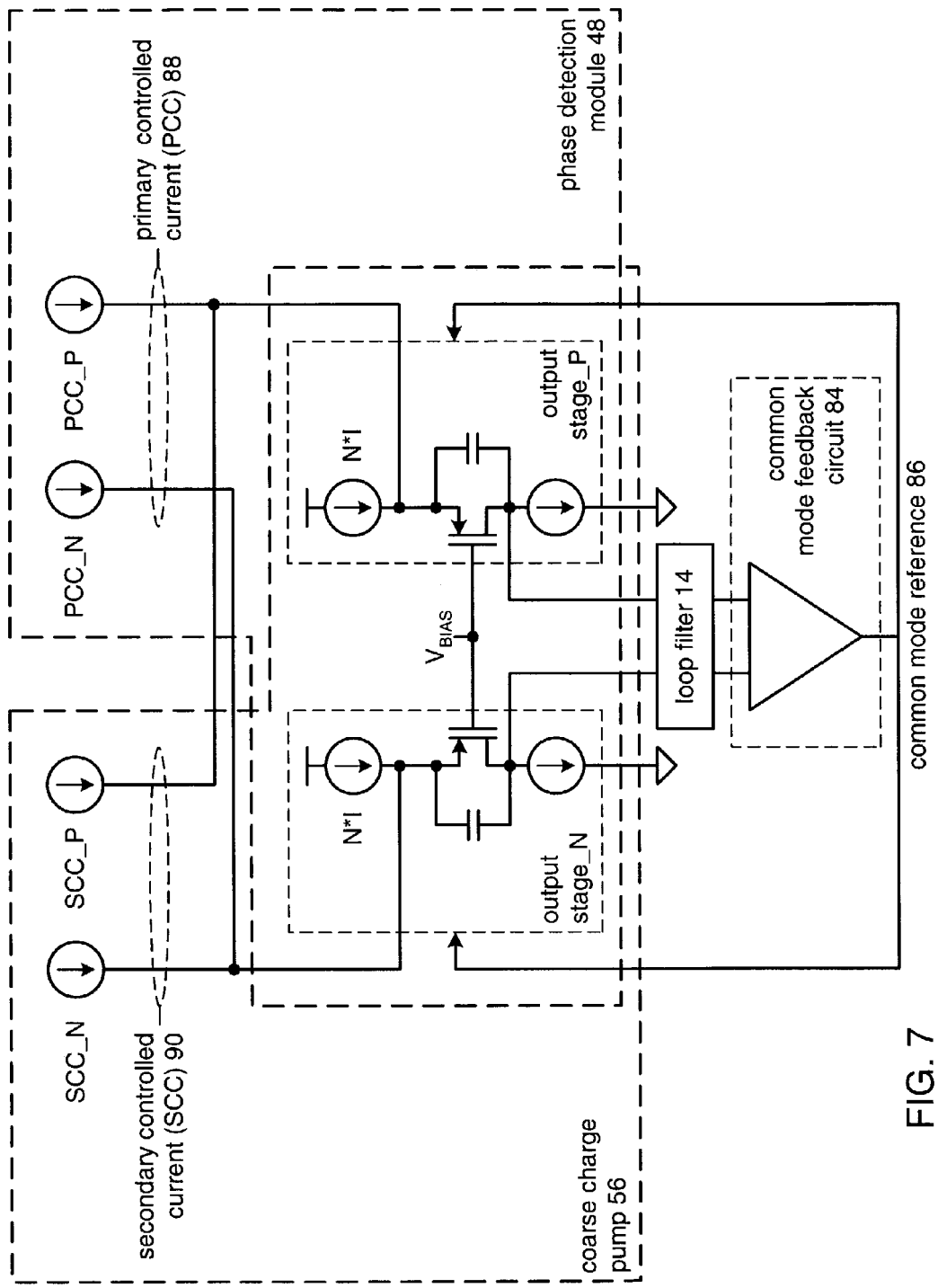
FIG. 7 is a schematic block diagram of the loop filter, the phase detection module, and the coarse charge pump of the high-speed, wide bandwidth data detection circuits of FIGS. 2 and 3.

FIG. 7 illustrates a schematic block diagram of the phase detection module 48, the coarse charge pump 56, the loop filter 14 and the common mode feedback circuit 84 of the data detection circuit of FIG. 3. In this embodiment, the phase detection module 48 includes an output stage for the negative leg of the differential controlled current (output stage_N) and an output stage for the positive leg of the differential controlled current (output stage_P). The phase detection module 48 also includes two current sources PCC_N and PCC_P that produce the primary controlled current (PCC) 88.

The coarse charge pump 56 shares the output stage_N and the output stage _P with the phase detection module 48. In addition, the coarse charge pump 56 includes two current sources SCC_N and SCC_P that produce the secondary controlled current (SCC) 90.

Output stages N and P provide the controlled current to loop filter 14 whether the controlled current is being generated by the coarse charge pump 56 or the phase detection module 48. The common mode feedback circuit 84, which may be an amplifier, monitors the current of the loop filter 14 and generates there from a common mode reference 86 that is fed back to the N and P output stages. The common mode reference 86 may adjust the current sources within the corresponding output stages and/or adjust the bias voltage of the transistors of the output stages. In addition to, or in the alternative, each output stage may include an additional transistor for common mode control and/or include an additional current source to adjust the common mode of each stage.

By sharing the output stages between the coarse charge pump 56 and phase detection module 48, a single common mode reference circuit 84 may be used. By utilizing a single common mode feedback circuit 84, as opposed to several common mode feedback circuits, the adverse effects of multiple common mode feedback circuits generating common mode noise is eliminated as is the adverse results caused thereby.

FIG. 8 is a schematic block diagram of a high-speed wide bandwidth data detection apparatus 160 that includes processing module 162 and memory 164. The processing module 162 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 164 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 162 implements one or more of its functions via a state machine, analog circuitry, digital circuitry, and/or logic circuitry, the memory storing the corresponding operational instructions may be embedded within, or external to, the circuitry comprising the state machine, analog circuitry, digital circuitry, and/or logic circuitry. The memory 164 stores, and the processing module 162 executes, operational instructions corresponding to at least some of the steps and/or functions illustrated in FIGS. 9–13.

FIG. 9 is a flowchart of a method for high-speed, wide bandwidth data detection that begins at Step 170. At Step 170, a controlled current is produced based on a current mode mathematical manipulation of differences between an incoming data stream and a recovered clock. The various ways of producing the controlled current will be described with reference to FIGS. 10 and 11.

The process then proceeds to Step 172 where detected data is produced based on the incoming data stream and the recovered clock. The process then proceeds to Step 174 where the controlled current is converted into a control voltage. The process then proceeds to Step 176 where the control voltage is converted into the recovered clock.

FIG. 10 illustrates a flowchart of a method for producing the controlled current at Step 170 of FIG. 9. This method begins at Step 180 where a $1^{st}$ portion of the current mode mathematical manipulation is performed on phase differences between the incoming data stream and the recovered clock to produce a $1^{st}$ component of the controlled current. The process then proceeds to Step 182 where a $2^{nd}$ portion of the current mode mathematical manipulation is performed on transition differences between the incoming data stream and the recovered clock to produce a $2^{nd}$ component of the controlled current.

The process then proceeds to Step 184 where a plurality of reference currents is generated. The process then proceeds to Step 186 where the controlled current is produced based on the plurality of reference currents, the $1^{st}$ portion of the controlled current and the $2^{nd}$ portion of the controlled current.

Figure 11:
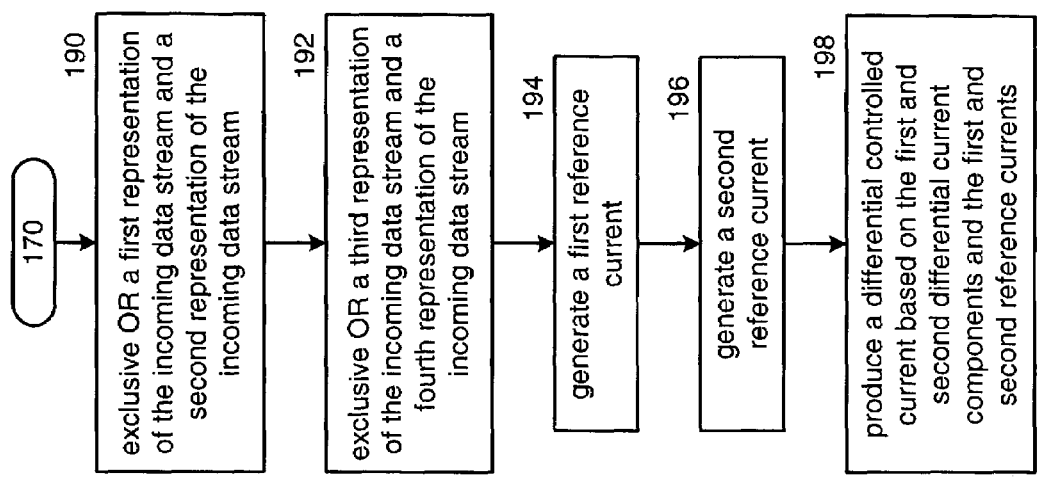

FIG. 11 is a flowchart of an alternate method for generating the control current of Step 170 of FIG. 9. This method begins at Step 190 where a $1^{st}$ representation of the incoming data stream is exclusive ORed with a $2^{nd}$ representation of the incoming data stream to produce a $1^{st}$ differential component of the controlled current. The $1_{st}$ and $2^{nd}$ representations may be produced by latches 104 and 106 as shown in FIG. 4, latches 121 and 123 as shown in FIG. 5 and/or latches 130 and 132 shown in FIG. 6.

The process then proceeds to Step 192 where a $3^{rd}$ representation of the incoming data and a $4^{th}$ representation of the incoming data are exclusive ORed to produce a $2^{nd}$ differential current component of the controlled current. The $3^{rd}$ and $4^{th}$ representations of the incoming data stream may be produced by latches 110 and 112 of FIG. 4, flip-flops 125 and 127 of FIG. 5, and/or flip-flops 134 and 135 of FIG. 6.

The process then proceeds to Step 194 where a $1^{st}$ reference current is produced and then to Step 196 where a $2^{nd}$ reference current is produced. Note that Steps 194 and 196 may be executed in parallel. Further note that the $1^{st}$ reference current may be generated by producing a $1^{st}$ current having a magnitude of approximately twice a magnitude of the $1^{st}$ differential current component, producing a $2^{nd}$ current having a magnitude of approximately N times the magnitude of the $1^{st}$ differential current, and combining the $1^{st}$ and $2^{nd}$ currents to produce the $1^{st}$ reference current. The $2^{nd}$ reference current may be produced by generating a $3^{rd}$ current having a magnitude of approximately twice a magnitude of the $2^{nd}$ differential current component, producing a $4^{th}$ current having a magnitude of approximately N times the magnitude of the $1^{st}$ differential current component, and combining the $3^{rd}$ and $4^{th}$ currents to produce the $2^{nd}$ reference current.

The process then proceeds to Step 198 where a differential controlled current is produced based on the $1^{st}$ and $2^{nd}$ differential current components and the $1^{st}$ and $2^{nd}$ reference currents.

Figure 12:
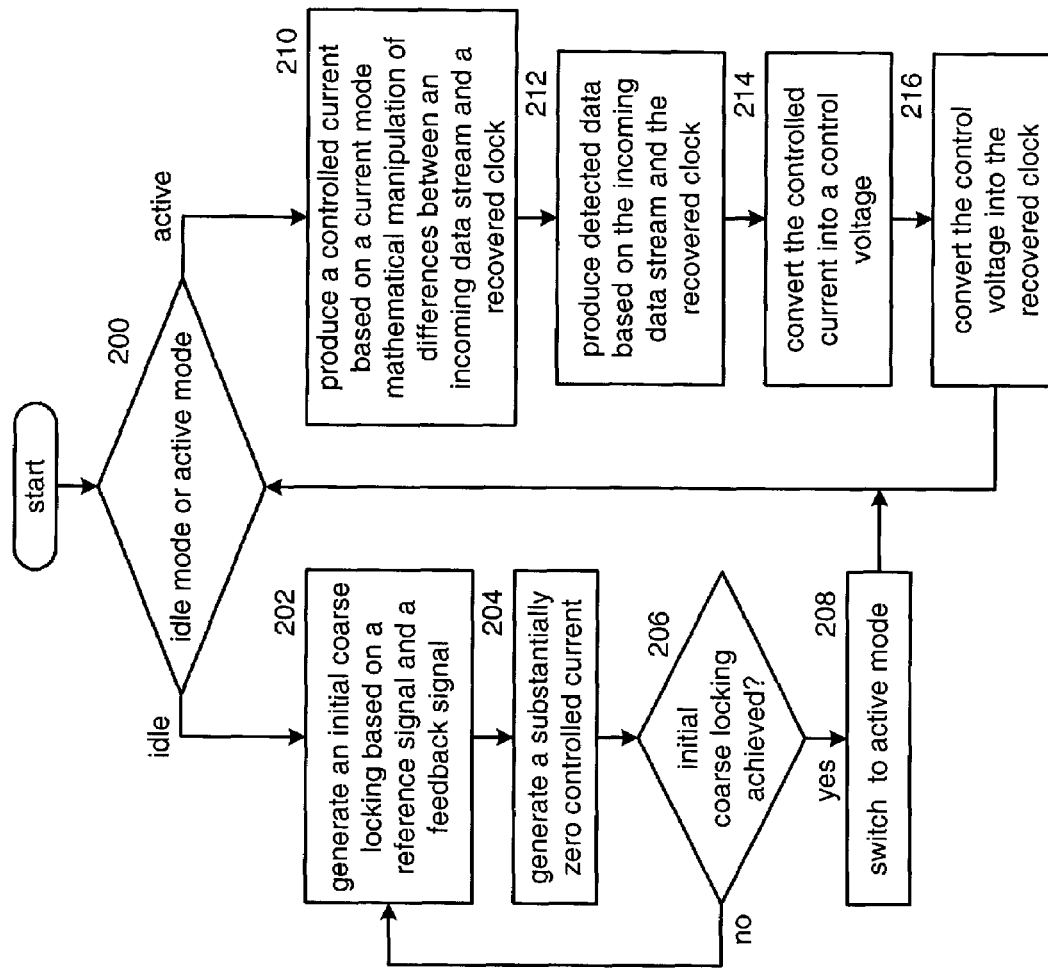
FIGS. 12 and 13 are a flowchart of an alternate method for high-speed, wide bandwidth data detection in accordance with the present invention.

FIG. 12 is a flowchart of an alternate method for high-speed, wide bandwidth data detection. The process begins at Step 200 where a determination is made as to whether an idle mode or an active mode is enabled. The idle mode may correspond to a coarse loop functionality of the data detection process and the active mode may correspond to a fine loop functionality of the data detection process. Typically, a data detection process will begin in the idle mode. When in the idle mode the process proceeds to Step 202 where an initial coarse locking is generated based on a reference signal and a feedback signal. The process then proceeds to Step 204 where a substantially zero control current for the fine locked loop operation is generated.

The process then proceeds to Step 206 where a determination is made as to whether the initial coarse locking is achieved. If not, the process continues to loop between Steps 202, 204 and 206. Once the initial coarse locking is achieved the process proceeds to Step 208 where the functionality is switched to the active or coarse mode. This transition from the idle mode of operation to the active mode of operation may be done during non-updating periods of generating the control current and/or of generating the substantially zero control current. Accordingly, the transition is made after the phase detection module has provided an update to the loop filter regarding a current measurement of phase differences between the incoming data stream and the recovered clock.

In the active mode, the process proceeds to Step 210 where a controlled current is generated based on a current mode mathematical manipulation of differences between an incoming data stream and a recovered clock. This may be done by producing phase information based on differences between the incoming data stream and the recovered clock and producing the controlled current based on the phase information. The production of the controlled current is further described in the flowchart of FIG. 13.

The process then proceeds to Step 212 where detected data is produced based on the incoming data stream on the recovered clock. The process then proceeds to Step 214 where the controlled current is converted into a control voltage. The process then proceeds to Step 216 where the control voltage is converted into the recovered clock. The process then loops back to Step 200 and while, the data detection remains in the active mode, the process will continue to loop through Steps 210–216.

Figure 13:
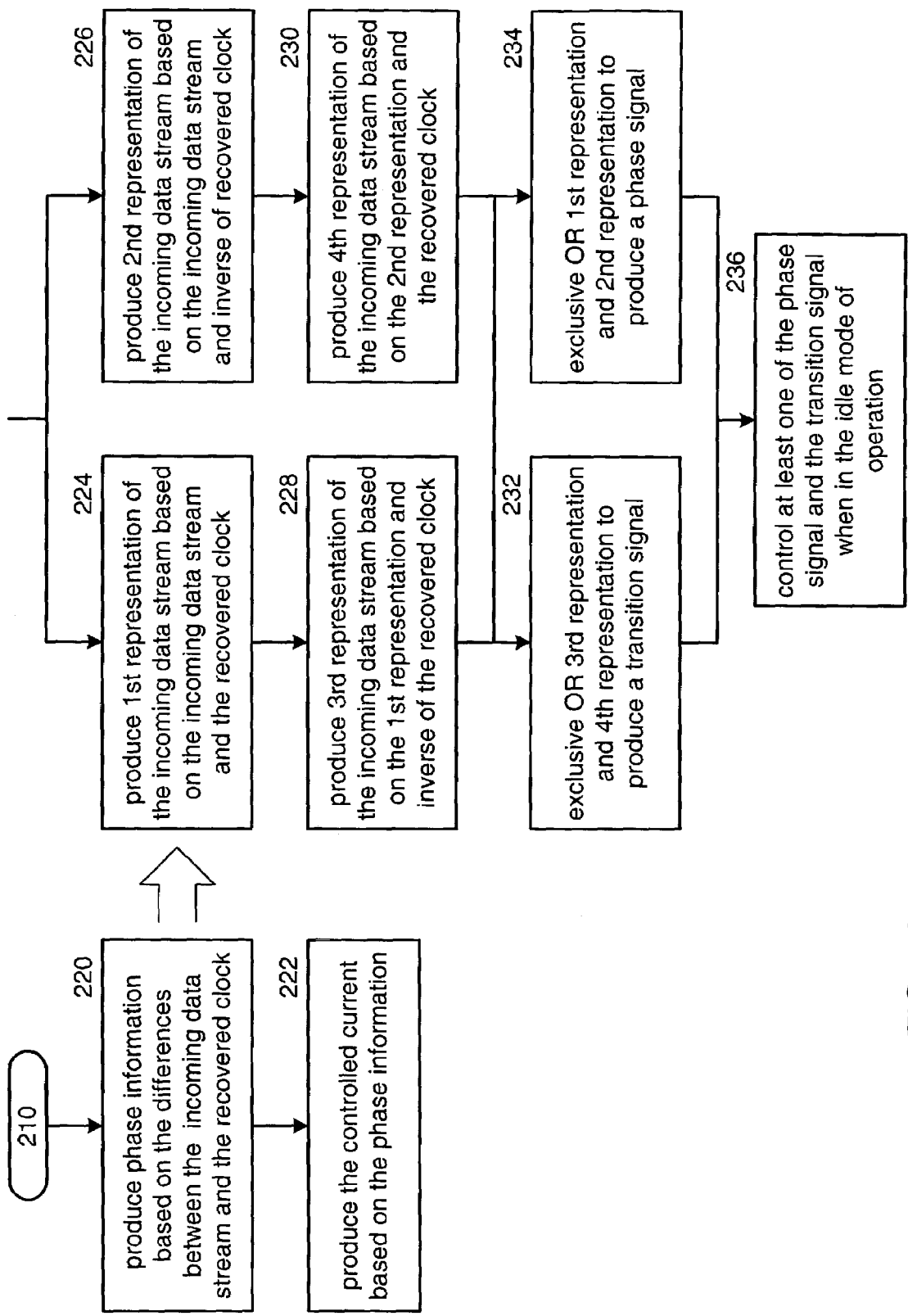

FIG. 13 is a flowchart of a method for producing the controlled current as shown in Step 210 of FIG. 12. The process begins at Step 220 where phase information is generated based on phase differences between the incoming data stream and the recovered clock. This may be done as illustrated in Steps 224–236, which will be subsequently described. The process proceeds from Step 220 to Step 222 where the controlled current is generated based on the phase information. The phase information is generated in both the idle mode and the active mode. When in the idle mode, the phase information is generated such that the controlled current is substantially zero.

The generation of the phase information may be done as depicted in Steps 224–236. At Step 234, a $1^{st}$ representation of the incoming data stream is produced based on the incoming data stream on the recovered clock. In addition, at Step 226 a $2^{nd}$ representation of the incoming data stream is produced based on the incoming data stream and inversion of the recovered clock. The process proceeds to Step 228 and 230 where at Step 228 a $3^{rd}$ representation of the incoming data stream is produced based on the $1^{st}$ representation and the inversion of the recovered clock. At Step 230, a $4^{th}$ representation of the incoming data stream is produced based on the $2^{nd}$ representation and the recovered clock. The processing then proceeds to Steps 232 and 234.

At Step 232, the $3^{rd}$ and $4^{th}$ representations are exclusive ORed to produce a transition signal. At Step 234 the $1^{st}$ and $2^{nd}$ representations are exclusively ORed to produce a phase signal. The process then proceeds to Step 236 where the phase signal and/or transition signals are controlled in the idle mode to produce the substantially zero controlled current. When the processing switches to the active mode, the phase information (i.e., the phase signal and the transition signal) is used to produce the controlled current.

The controlling of the phase signal and/or transition signal when in the idle mode may be done by forcing the outputs of the exclusive OR functions to a known state and/or by forcing the $1^{st}$ and $2^{nd}$ representations to a same known state (i.e., a logic zero or a logic 1). In this manner, the phase and transitions signals will be zero when the data detection is in the idle mode and transitions in a known manner when the data detection is in the active mode.

The preceding discussion has presented a high-speed, wide bandwidth data detection circuit that is readily adept at accurately recovering data and a clock from high-speed serial transitions. This is achieved, at least in part, by utilizing a single common mode reference for the loop filter, by eliminating a voltage-to-voltage-to-current conversion to produce a controlled current provided to the loop filter, and/or by controlling the current produced by the phase detection module during the coarse loop operation of a data detection circuit. As one of average skill in the art will appreciate, other embodiments may be derived from the teachings of the present invention without deviating from the scope of the claims.

What is claimed is:

1. A high-speed, wide bandwidth data detection circuit comprises:

phase detection module operably coupled to produce controlled current based on a current mode mathematical manipulation of differences between an incoming data stream and a recovered clock;

data detection module operably coupled to produce the detected data based on the incoming data stream and the recovered clock;

loop filter operably coupled to convert the controlled current into a control voltage;

voltage controlled oscillator operably coupled to convert the control voltage into the recovered clock; and wherein the phase detection module comprises:

a first differential exclusive OR gate operably coupled to produce a first differential current component of the controlled current based on a first representation of the incoming data stream and a second representation of the incoming data stream;

a second differential exclusive OR gate operably coupled to produce a second differential current component of the controlled current based on a third representation of the incoming data stream and a fourth representation of the incoming data stream;

a first current source module operably coupled to provide a first reference current;

a second current source module operably coupled to provide a second reference current; and a differential common gate amplifier circuit operably coupled to the first and second differential exclusive OR gates and to the first and second current source modules, wherein the differential common gate amplifier circuit produces a differential controlled current based on the first and second differential current components and the first and second reference currents.

2. The high-speed, wide bandwidth data detection circuit of claim 1 further comprises:

a first latch operably coupled to produce the first representation of the incoming data stream based on the incoming data stream and the recovered clock;

a second latch operably coupled to produce the second representation of the incoming data stream based on the incoming data stream and an inverse of the recovered clock;

a first flip-flop operably coupled to produce the third representation of the incoming data stream based on the first representation of the incoming data stream and the inverse of the recovered clock; and a second flip-flop operably coupled to produce the fourth representation of the incoming data stream based on the second representation of the incoming data stream and the recovered clock.

3. The high-speed, wide bandwidth data detection circuit of claim 1 further comprises:

the first current source module including a first reference current source and a second reference current source, wherein the first reference current source provides a current having a magnitude approximately twice a magnitude of the first differential current component, and wherein the second reference current source provides a current having a magnitude approximately N times the magnitude of the first differential current component, wherein the currents produced by the first and second reference current sources are provided as the first reference current to one differential input of the differential common gate amplifier circuit; and the second current source module including a third reference current source and a fourth reference current source, wherein the third reference current source provides a current having a magnitude approximately twice a magnitude of the second differential current component, and wherein the fourth reference current source provides a current having a magnitude approximately N times the magnitude of the first differential current component, wherein the currents produced by the third and fourth reference current sources are provided as the second reference current to another differential input of the differential common gate amplifier circuit.

4. The high-speed, wide bandwidth data detection circuit of claim 1, wherein the phase detection module further comprises:

a common mode feedback circuit operably coupled to the differential common gate amplifier circuit.

5. A method for high-speed wide bandwidth data detection, the method comprises:

producing a controlled current based on a current mode mathematical manipulation of differences between an incoming data stream and a recovered clock;

producing detected data based on the incoming data stream and the recovered clock;

converting the controlled current into a control voltage;

converting the control voltage into the recovered clock; and wherein producing the controlled current includes, exclusive ORing a first representation of the incoming data stream and a second representation of the incoming data stream to produce a first differential current component of the controlled current;

exclusive ORing a third representation of the incoming data stream and a fourth representation of the incoming data stream to produce a second differential current component of the controlled current;

generating a first reference current;

generating a second reference current; and producing a differential controlled current based on the first and second differential current components and the first and second reference currents.

6. The method of claim 5 further comprises:
generating the first reference current by:
producing a first current having a magnitude approximately twice a magnitude of the first differential current component;
producing a second current having a magnitude approximately N times the magnitude of the first differential current component;
combining the first and second currents to produce the first reference current; and
generating the second reference current by:
producing a third current having a magnitude approximately twice a magnitude of the second differential current component;
producing a fourth current having a magnitude approximately N times the magnitude of the first differential current component; and
combining the third and fourth currents to produce the second reference current.

7. An apparatus for high-speed wide bandwidth data detection, the apparatus comprises:
processing module;
memory operably coupled to the processing module, wherein the memory includes operational instructions that cause the processing module to:
produce a controlled current based on a current mode mathematical manipulation of differences between the incoming data stream and a recovered clock;
produce detected data based on the incoming data stream and the recovered clock;
convert the controlled current into a control voltage; and
convert the control voltage into the recovered clock; and
wherein the memory further comprises operational instructions that cause the processing module to generate the controlled current by:
exclusive ORing a first representation of the incoming data stream and a second representation of the incoming data stream to produce a first differential current component of the controlled current;
exclusive ORing a third representation of the incoming data stream and a fourth representation of the incoming data stream to produce a second differential current component of the controlled current;
generating a first reference current;
generating a second reference current; and
producing a differential controlled current based on the first and second differential current components and the first and second reference currents.

8. The apparatus of claim 7, wherein the memory further comprises operational instructions that cause the processing module to:
generate the first reference current by:
producing a first current having a magnitude approximately twice a magnitude of the first differential current component;
producing a second current having a magnitude approximately N times the magnitude of the first differential current component;
combining the first and second currents to produce the first reference current; and
generate the second reference current by:
producing a third current having a magnitude approximately twice a magnitude of the second differential current component;
producing a fourth current having a magnitude approximately N times the magnitude of the first differential current component; and
combining the third and fourth currents to produce the second reference current.

9. A high-speed, wide bandwidth data detection circuit comprises:
primary locked loop operably coupled to process an incoming data stream to produce detected data and a recovered clock, wherein the primary locked loop includes:
phase detection module operably coupled to produce controlled current based on a current mode mathematical manipulation of differences between the incoming data stream and the recovered clock, wherein, when the primary locked loop is in an idle state, the phase detection module produces a substantially zero controlled current, and when the primary locked loop transitions from the idle state to an active state, the phase detection module produces the controlled current in a known manner;
data detection module operably coupled to produce the detected data based on the incoming data stream and the recovered clock; loop filter operably coupled to convert the controlled current into a control voltage;
voltage controlled oscillator operably coupled to convert the control voltage into the recovered clock;
secondary locked loop operably coupled to provide an initial coarse locking for the primary locked loop when the primary locked loop is in the idle state; and
state transition module operably coupled to place the primary locked loop in the idle state and the secondary locked loop in the active state and to switch the primary locked loop from the idle state to the active state and to switch the second locked loop from the active state to the idle state during non-updating periods of the phase detection module.

10. The high-speed, wide bandwidth data detection circuit of claim 9, wherein the phase detection module further comprises:
phase detection circuit operably coupled to produce phase information based on the phase difference between the incoming data stream and the recovered clock; and
a charge pump circuit operably coupled to produce the controlled current based on the phase information, wherein, when the primary locked loop is in the idle state, the phase detection circuit generates the phase information such that the charge pump circuit produces the substantially zero controlled current.

11. The high-speed, wide bandwidth data detection circuit of claim 10, wherein the phase detection circuit further comprises:
a first exclusive OR gate operably coupled to produce a phase signal of the phase information based on first representation of the incoming data stream and a second representation of the incoming data stream;
a second exclusive OR gate operably coupled to produce a transition signal of the phase information based on a third representation of the incoming data stream and a fourth representation of the incoming data stream;
a first latch operably coupled to produce the first representation of the incoming data stream based on the incoming data stream and the recovered clock;

a second latch operably coupled to produce the second representation of the incoming data stream based on the incoming data stream and an inverse of the recovered clock;

a first flip-flop operably coupled to produce the third representation of the incoming data stream based on the first representation of the incoming data stream and the inverse of the recovered clock;

a second flip-flop operably coupled to produce the fourth representation of the incoming data stream based on the second representation of the incoming data stream and the recovered clock; and control module operably coupled to control at least one of the phase signal and the transition signal when the primary locked loop is in the idle state.

12. The high-speed, wide bandwidth data detection circuit of claim 11, wherein the control module further function to control the phase signal or the transition signal by at least one of:

forcing an output of the first exclusive OR gate to a known state;

forcing an output of the second exclusive OR gate to a known state;

forcing inputs of the first exclusive OR gate to a same known state;

forcing inputs of the second exclusive OR gate to a same known state;

forcing inputs of the first and second latches to a known state; and forcing inputs of the first and second flip-flops to a known state.

13. A method for high-speed, wide bandwidth data detection, the method comprises:

generating an initial coarse locking based on a reference signal and a feedback signal during an idle mode of operation;

generating a substantially zero controlled current during the idle mode of operation; when the initial coarse locking is achieved, switching from the idle mode of operation to an active mode of operation;

when in the active mode of operation: producing a controlled current based on a current mode mathematical manipulation of differences between an incoming data stream and a recovered clock, wherein transition from the substantially zero controlled current to the controlled current is done in a known manner;

producing detected data based on the incoming data stream and the recovered clock; converting the controlled current into a control voltage;

converting the control voltage into the recovered clock; and wherein the memory further comprises operational instructions that cause the processing module to: transitioning from the idle mode of operation to the active mode of operation during non-updating periods of the generating of the controlled current and of the generating of the substantially zero controlled current.

14. The method of claim 13, wherein the producing the controlled current further comprises:

producing phase information based on the differences between the incoming data stream and the recovered clock; and producing the controlled current based on the phase information, wherein, when in the idle mode of operation, the phase information is such that the controlled current is the substantially zero controlled current.

15. The method of claim 14, wherein the producing the phase information further comprises:

exclusive ORing a first representation of the incoming data stream and a second representation of the incoming data stream to produce a phase signal of the phase information;

exclusive ORing a third representation of the incoming data stream and a fourth representation of the incoming data stream to produce a transition signal of the phase information;

producing the first representation of the incoming data stream based on the incoming data stream and the recovered clock;

producing the second representation of the incoming data stream based on the incoming data stream and an inverse of the recovered clock;

producing the third representation of the incoming data stream based on the first representation of the incoming data stream and the inverse of the recovered clock;

producing the fourth representation of the incoming data stream based on the second representation of the incoming data stream and the recovered clock; and controlling at least one of the phase signal and the transition signal when in the idle mode of operation.

16. The method of claim 15, wherein the controlling of the phase signal or the transition signal further comprises at least one of:

forcing a result of the exclusive ORing of the first and second representations of the incoming data stream to a known state;

forcing a result of the exclusive ORing of the third and fourth representations of the incoming data stream to a known state;

forcing the first and second representations of the incoming data stream to a same known state; and forcing the third and fourth representations of the incoming data stream to a same known state.

17. An apparatus for high-speed, wide bandwidth data detection, the apparatus comprises:

processing module;

memory operably coupled to the processing module, wherein the memory includes operational instructions that cause the processing module to:

generate an initial coarse locking based on a reference signal and a feedback signal during an idle mode of operation;

generate a substantially zero controlled current during the idle mode of operation;

when the initial coarse locking is achieved, switch from the idle mode of operation to an active mode of operation;

when in the active mode of operation:

produce a controlled current based on a current mode mathematical manipulation of differences between an incoming data stream and a recovered clock, wherein transition from the substantially zero controlled current to the controlled current is done in a known manner;

produce detected data based on the incoming data stream and the recovered clock;

convert the controlled current into a control voltage;

convert the control voltage into the recovered clock;

wherein the memory further comprises operational instructions that cause the processing module to: transition from the idle mode of operation to the active mode of operation during non-updating periods of the generating of the controlled current and of the generating of the substantially zero controlled current.

18. The apparatus of claim 17, wherein the memory further comprises operational instructions that cause the processing module to produce the controlled current by:
producing phase information based on the phase difference between the incoming data stream and the recovered clock; and
producing the controlled current based on the phase information, wherein, when in the idle mode of operation, the phase information is such that the controlled current is the substantially zero controlled current.

19. The apparatus of claim 18, wherein the memory further comprises operational instructions that cause the processing module to produce the phase information by:
exclusive ORing a first representation of the incoming data stream and a second representation of the incoming data stream to produce a phase signal of the phase information;
exclusive ORing a third representation of the incoming data stream and a fourth representation of the incoming data stream to produce a transition signal of the phase information;
producing the first representation of the incoming data stream based on the incoming data stream and the recovered clock;
producing the second representation of the incoming data stream based on the incoming data stream and an inverse of the recovered clock;
producing the third representation of the incoming data stream based on the first representation of the incoming data stream and the inverse of the recovered clock;
producing the fourth representation of the incoming data stream based on the second representation of the incoming data stream and the recovered clock; and
controlling at least one of the phase signal and the transition signal when in the idle mode of operation.

20. The apparatus of claim 19, wherein the memory further comprises operational instructions that cause the processing module to control the phase signal or the transition signal by at least one of:
forcing a result of the exclusive ORing of the first and second representations of the incoming data stream to a known state;
forcing a result of the exclusive ORing of the third and fourth representations of the incoming data stream to a known state;
forcing the first and second representations of the incoming data stream to a same known state; and
forcing the third and fourth representations of the incoming data stream to a same known state.

21. A high-speed, wide bandwidth data detection circuit comprises:
phase detection module operably coupled to produce primary controlled current based on a current mode mathematical manipulation of phase differences between the incoming data stream and a recovered clock when fine loop operation is enabled;
data detection module operably coupled to produce the detected data based on the incoming data stream and the recovered clock;
frequency detector operably coupled to produce a frequency difference signal based on frequency differences between a reference signal and a feedback signal when coarse loop operation is enabled;
charge pump operably coupled to convert the frequency difference signal into a secondary controlled current when the coarse loop operation is enabled;
loop filter operably coupled to convert the primary controlled current or the secondary controlled current into a control voltage;
common mode feedback circuit operably coupled to the loop filter to provide a common mode reference for the primary and secondary controlled currents;
voltage controlled oscillator operably coupled to convert the control voltage into the recovered clock when the fine loop operation is enabled and to convert the control voltage into an intermediate clock when the coarse loop operation is enabled; and
divider module operably coupled to produce the feedback signal based on the intermediate clock and a divider value.

22. The high-speed, wide bandwidth data detection circuit of claim 21, wherein the common mode feedback circuit further comprises:
a first current source operably coupled to one differential input of the loop filter and to a common mode reference voltage; and
a second current source operably coupled to another differential input of the loop filter and to the common mode reference voltage.

23. The high-speed, wide bandwidth data detection circuit of claim 21 further comprises:
the phase detection module including an output stage to provide the primary controlled current to the loop filter; and
the charge pump including an output stage to provide the secondary controlled current to the loop filter, wherein the output stage provides a zero net current for the secondary controlled current when the fine loop operation is enabled.

24. The high-speed, wide bandwidth data detection circuit of claim 23, wherein the output stages of the phase detection module and the charge pump each further comprises:
reference current source operably coupled to provide a reference current;
common gate amplifier operably coupled to the reference current source; and
common mode controlled current source operably coupled to the common gate amplifier, wherein a node coupling the reference current source to the common gate amplifier provides an input for the output stage and a node coupling the common gate amplifier to the common mode controlled current source provides an output of the output stage.

25. A phase detection module comprising:
first current mode logic circuit operably coupled to perform a first portion of a current mode mathematical manipulation on phase differences between an incoming data stream and a recovered clock to produce a first differential current component of a controlled current, the first current mode logic circuit including,
a first differential exclusive OR gate operably coupled to produce the first differential current component of the controlled current based on a first representation of the incoming data stream and a second representation of the incoming data stream; and
a first current source module operably coupled to provide a first reference current;

second current mode logic circuit operably coupled to perform a second portion of the current mode mathematical manipulation on transition differences between the incoming data stream and the recovered clock to produce a second differential current component of the controlled current, the second current mode logic circuit including, a second differential exclusive OR gate operably coupled to produce the second differential current component of the controlled current based on a third representation of the incoming data stream and a fourth representation of the incoming data stream; and a second current source module operably coupled to provide a second reference current; and a differential common gate amplifier circuit operably coupled to the first and second differential exclusive OR gates and to the first and second current source modules, wherein the differential common gate amplifier circuit produces a differential controlled current based on the first and second differential current components and the first and second reference currents.

* * * * *